(12) United States Patent
Carballo

(10) Patent No.: US 7,471,755 B2
(45) Date of Patent: *Dec. 30, 2008

(54) METHODS AND ARRANGEMENTS FOR LINK POWER REDUCTION

(75) Inventor: Juan-Antonio Carballo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/941,075

(22) Filed: Nov. 15, 2007

(65) Prior Publication Data

US 2008/0069279 A1    Mar. 20, 2008

Related U.S. Application Data

(63) Continuation of application No. 10/743,614, filed on Dec. 22, 2003, now Pat. No. 7,315,595.

(51) Int. Cl.
*H04L 7/00* (2006.01)
(52) U.S. Cl. ..................................... 375/355
(58) Field of Classification Search ........................ None
See application file for complete search history.

(56) References Cited

U.S. PATENT DOCUMENTS

| 6,937,679 | B2 | 8/2005 | Skinner |
| 2004/0201457 | A1 | 10/2004 | O'Toole et al. |
| 2004/0228396 | A1 | 11/2004 | Wood, Jr. |
| 2005/0069071 | A1 | 3/2005 | Kim et al. |

OTHER PUBLICATIONS

Kun Jung Chang, et al., 50 GB/S 32X32 CMOS Crossbar Chip Using, VLSI Circuits Issue Digest of Technical Papers, 1999, pp. 17-19.
M. J. Lee, et al., 84-m W 4-Gb/s Clock and Data Recovery Circuit for Serial Link Applications, Symp(osium on VLSI Circuits Issue Digest of Technical Papers, 2001, pp. 149-152.
J.M. Khoury, et al., High Speed Serial Transceivers for Data, IEEE Communications Magazine, Issue Jul. 2001, vol. 39, Issue 7, pp. 160-165.

(Continued)

*Primary Examiner*—Khanh C Tran
(74) *Attorney, Agent, or Firm*—Casimer K. Salys; Schubert Osterrieder & Nickelson PLLS

(57) ABSTRACT

Methods, and arrangements for extension of clock and data recovery (CDR) loop latency and deactivation of CDR circuits are disclosed. In particular, embodiments address situations in which a receiver, designed to handle spread spectrum clocking, may not always or continuously encounter spread spectrum signals. As a result, power consumption by the receivers may be reduced. Embodiments identify situations in which spread spectrum clocking is unnecessary and may adapt the CDR loop to operate with less power consumption by, e.g., reducing the operating frequency of CDR circuits. For instance, some embodiments employ a flywheel circuit, incorporated into many spread spectrum CDR loops to accelerate adjustments to a sampling clock, to determine when spread spectrum signals are not being encountered. A loop latency controller may then, advantageously, reduce power consumption by reducing frequencies of operation and voltages, and merging or simplifying stages.

14 Claims, 4 Drawing Sheets

OTHER PUBLICATIONS

R. Farjad-Rad, et al., C. 3-M CMOS 8 Gigabit/S 4-PAM Serial Link, IEEE Journal of Solid State State Circuits, Issue May 2000, pp. 757-764.

W. Dally, et al., Transmitter Equal for 4 Gbits/Second Sig., Proc Hot Interconnects Symposium, Issue Aug. 1996, pp. 29-39.

C.K. Ken Yang, et al., 0.5 M CMOS 4GB/S Serial Link Transceiver, IEEE Journal of Solid State Circuits, Issue May 1998, pp. 713-722.

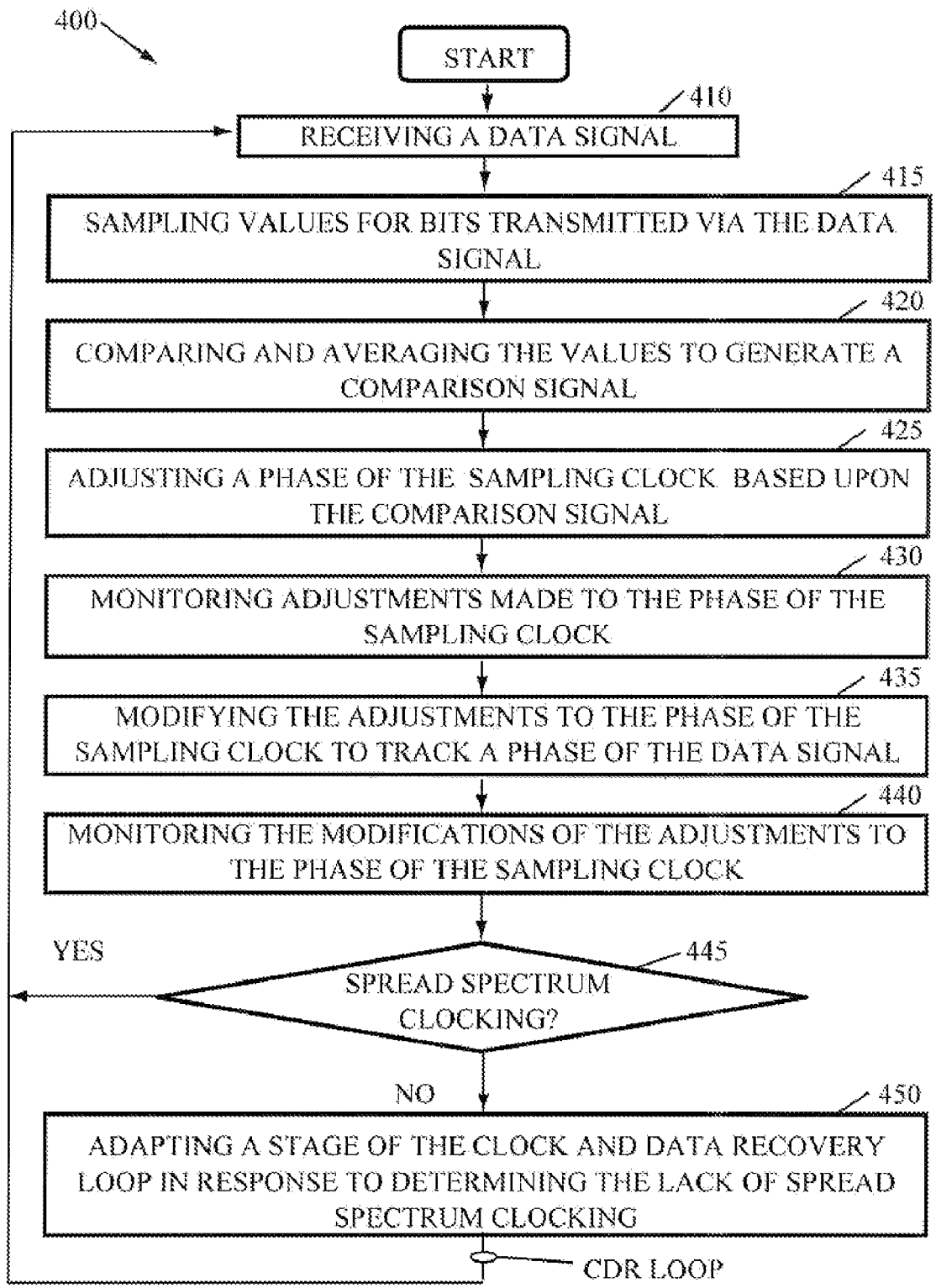

METHODS AND ARRANGEMENTS FOR LINK POWER REDUCTION

CROSS-REFERENCES TO RELATED APPLICATIONS

This application is a continuation application of U.S. patent application Ser. No. 10/743,614, entitled "METHODS AND ARRANGEMENTS FOR LINK POWER REDUCTION", filed Dec. 22, 2003 now U.S. Pat. No. 7,315,595, the disclosure of which is incorporated herein in its entirety for all purposes.

FIELD OF INVENTION

The present invention is the field of clock circuits. More particularly, the present invention relates to methods and arrangements for link power reduction based upon deactivation of clock and data recovery circuits and extension of clock and data recovery loop latency when spread spectrum signals are not present.

BACKGROUND

Communication systems involve a transmitter, a channel, and a receiver. Data is clocked by the transmitter and transmitted to a receiver, e.g., from a router to a hub or from one processor card to another processor card. However, the clock signal utilized to clock the data may not be transmitted with the data. One reason for not transmitting the clock signal with the data is that the clock signal induces noise to the data streams, increasing bit errors. Second, transmission of the clock signal utilizes bandwidth that could otherwise be used to transmit additional data. Third, transmitting the clock signal consumes power that is unnecessary because the receiver can reproduce the clock signal. Thus, in many applications, the clock signal is not transmitted with the data.

Even when transmitting data across a transmission medium without the corresponding clock signals, noise introduced during transmission of the data signal, such as transmitter jitter, channel jitter and data dependent jitter, reduces the sampling window for data. For example, transmitter jitter can result from many sources such as feed through, random jitter, systematic offsets and duty cycle distortion. Duty cycle distortion, for instance, is caused by non-symmetric positive and negative duty cycles of a data symbol and can show up either as a high frequency correlated jitter or as a phase step. Further, channel jitter can result from phase dispersion, such as inter-symbol interference (ISI). When a long stream of ones, for example a sinusoid of 8 MHz and 24 MHz, transitions into a long stream of zeros, for example a sinusoid of 16 MHz, differences in the propagation delay between 8 MHz, 16 MHz, and 24 MHz of the transmission medium can cause phase shifts at each transition point. The phase shifts, phase steps, and reduced duty cycles reduce the perceivable sampling window by the receiver.

When the data is transmitted without the clock signal, clocks in both the transmitter and the receiver must be coordinated to match so that data can be sampled at the center of the data sampling window. If the clocks are at substantially the same frequency, matching the clock signals is just a matter of adjusting the phase of the receiver clock to match the phase of the transmitter's clock. The phases can be matched by monitoring for a phase shift in the data.

Receivers may compensate for the smaller sampling window by attempting to align a data sampling clock signal, or recovered clock signal, with the center of the data-sampling window. More specifically, receivers typically implement a clock and data recovery (CDR) loop to track differences in phase between the data signal and sampling clock and modify the phase of the sampling clock to track the data signal. When the sampling clock is in phase with the data signal, a 90-degree phase-shift of the sampling clock will place transitions of the phase-shifted clock in the center of the sampling window.

Computations based upon sample values for bits of the data signal (typically two to four values per bit) indicate whether the phase of the sampling clock is out of sync with the phase of the data signal. For instance, assuming that the bit being sampled is a high voltage, and the prior and subsequent bits are low voltages, three sample values of the bit may be read from the data signal based upon transitions of the sampling clock. When the phase of the sample clock lags the phase of the data signal, the first two sample values read from the data signal will be a high voltage read from the bit and the next sample value will be a low voltage read from the next bit. Similarly, when the phase of the sample clock leads the phase of the data signal, the first sample value will be a low voltage read from the previous bit and the next two sample values will be a high voltage. Generally, the results are averaged over a sampling window of bits and, when, on average, the sampling clock is determined to be leading or lagging, the phase of the sampling clock is modified accordingly.

However, sometimes there is a difference between the internal frequency of the transmitter and receiver for clocking the data and that difference may vary with time, which is often referred to as spread spectrum signaling. Spread spectrum clocking is typically designed into the CDR loop to compensate for spread spectrum signaling. Spread spectrum clocking circuitry is incorporated into the design of the CDR loop to handle spread spectrum clocking. Spread spectrum clocking circuitry includes complex logic that operates at high frequencies to monitor the phase shifts in a data signal.

The complex logic and high frequency demands are dependent upon bandwidth requirements and bit error rate (BER) specifications. Bandwidth is the amount of data transmitted per unit of time and BER is the percentage of bits with errors divided by the total number of bits transmitted, received or processed per unit of time. Essentially, BER is the digital equivalent of the signal-to-noise ratio fro analog systems. Thus, higher bandwidths and lower BERs require spread spectrum clocking circuitry to incorporate more complex logic and operate at higher frequencies to process data signals, especially when the data signals are spread spectrum signals. The cost of handling the spread spectrum signals is then realized in power consumption by the spread spectrum clocking circuitry and silicon area requirements for the spread spectrum clocking circuitry, neither of which can be reduced without relaxing the specifications for bandwidth, BER, or spread spectrum clocking.

Many receivers are designed for the worst case, high frequency changes that the receiver may encounter. Those receivers include CDR loops that are typically over designed for the signals that they normally encounter and, as a result, consume significantly more power than is necessary. In particular, many receivers that encounter spread spectrum signals, do not encounter the spread spectrum signals often. Thus, the additional power consumption related to the spread spectrum clocking circuitry is unnecessary most of the time, and possibly all of the time for some applications.

SUMMARY OF THE INVENTION

The problems identified above are in large part addressed by methods and arrangements for deactivation of clock and data recovery circuits and extension of clock and data recovery loop latency when spread spectrum signals are not present. One embodiment provides an apparatus for reducing power consumption by a clock and data recovery loop. The apparatus contemplates a flywheel to monitor adjustments made in a phase of a sampling clock by a phase controller, the sampling clock being generated to sample bit values from a data signal, and to modify the adjustments in the phase of the sampling clock to track a phase of the data signal; and a loop latency controller to monitor the modifications of the adjustments in the phase of the sampling clock, to determine the existence of spread spectrum clocking based upon a frequency of the modifications, and, in response, to adapt a stage of the clock and data recovery loop.

Another embodiment provides a method for reducing power consumption by a clock and data recovery loop. The method contemplates monitoring adjustments made in a phase of a sampling clock by a phase controller, the sampling clock being generated to sample bit values from a data signal; modifying the adjustments in the phase of the sampling clock to track a phase of the data signal; and monitoring the modifications of the adjustments in the phase of the sampling clock; determining the existence of spread spectrum clocking based upon a frequency of the modifications; and adapting a stage of the clock and data recovery loop in response to determining the lack of spread spectrum clocking.

Another embodiment provides a clock and data recovery loop. The clock and data recovery loop generally includes a clock generator to generate a sampling clock; sampling circuitry to sample values for a bit from a data signal based upon the sampling clock; comparison circuitry to compare the values for the bit to generate a comparison signal indicative of a difference between the phase of the sampling clock and the phase of the data signal; a phase controller to adjust the phase of sampling clock in response to the comparison signal; a flywheel to monitor adjustments in the phase of the sampling clock by the phase controller and to modify the adjustments in the phase of the sampling clock to track the phase of the data signal; and a loop latency controller to monitor the modifications of the adjustments in the phase of the sampling clock, to determine the existence of spread spectrum clocking based upon a frequency of the modifications, and, in response, to adapt a stage of the clock and data recovery loop.

BRIEF DESCRIPTION OF THE DRAWINGS

Other objects and advantages of the invention will become apparent upon reading the following detailed description and upon reference to the accompanying drawings in which, like references may indicate similar elements:

FIG. 4 depicts embodiment of a flow chart for reducing power consumption in a CDR loop.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments, but on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Generally speaking, methods and arrangements for extension of clock and data recovery (CDR) loop latency and deactivation of CDR circuits are contemplated. In particular, embodiments address situations in which a receiver, designed to handle spread spectrum clocking, may not always or continuously encounter spread spectrum signals. As a result, power consumption by the receivers may be reduced. Embodiments identify situations in which spread spectrum clocking is unnecessary and may adapt the CDR loop to operate with less power consumption by, e.g., reducing the operating frequency of CDR circuits. For instance, some embodiments employ a flywheel circuit, incorporated into many spread spectrum CDR loops to accelerate adjustments to a sampling clock, to determine when spread spectrum signals are not being encountered. A loop latency controller may then, advantageously, reduce the frequency of internal circuits that adjust the sampling clock, which advantageously reduces power consumption. In addition, the operation voltages of the CDR loop may also be reduced to reduce power consumption because circuit elements operating at a lower frequency may be able to operate at a lower voltage.

Further embodiments deactivate stages, or circuits, of the CDR loop to reduce power consumption by the receiver. In particular, when the frequency of adjustments being made to the sampling clock is reduced, circuitry incorporated into the design of the CDR loop to handle the high-speed changes required for spread spectrum signaling is unnecessary.

While specific embodiments will be described below with reference to particular circuit configurations of CDR loops, those of skill in the art will realize that embodiments of the present invention may advantageously be implemented with other substantially equivalent circuit configurations.

Figure 1:
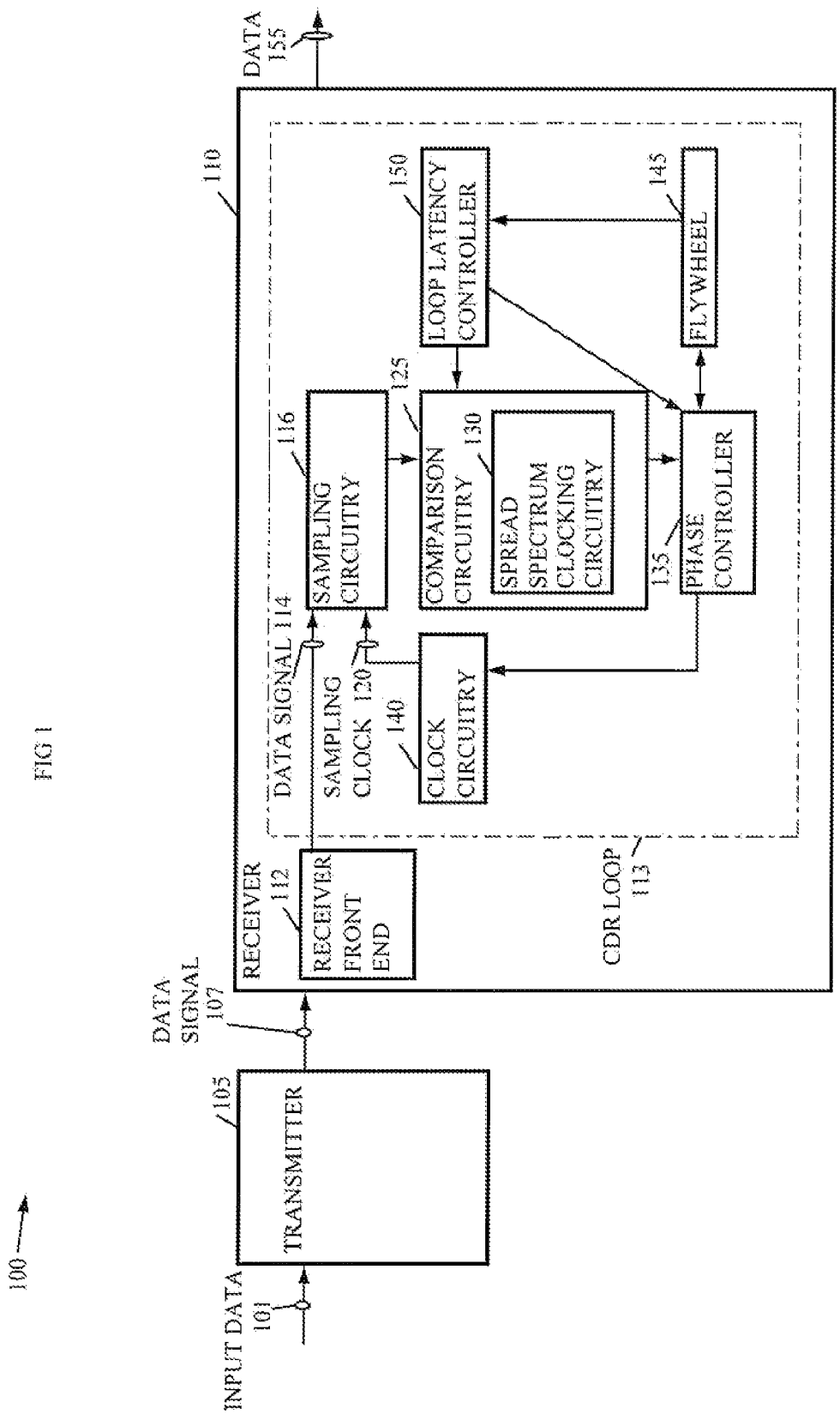
FIG. 1 depicts an embodiment of a transmitter coupled with a receiver having a clock and data recovery (CDR) loop to re-clock a data signal.

Turning now to the drawings, FIG. 1 depicts an embodiment of a transmitter 105 coupled with a receiver 110 having a clock and data recovery (CDR) loop 113 to re-clock a data signal 107. For example, transmitter 105 may receive input data 101, determine the data communicated by input data 101, and transmit the data to receive 110. Receiver 110 may then re-clock the data and output the data as data 155.

Transmitter 105 may receive input data 101 and transmit input data 101 with a clock signal that is not included in data signal 107. For instance, transmitter 105 may receive 8 bits of data in parallel and serialize the data transmission. Transmitter 105 may also comprise a first-in, first-out (FIFO) data queue to compensate for frequency offset and circuitry to accommodate a disparity in the data rates between the frequency of data input 101 and the frequency of data signal 107.

Data signal 107 may be received via a 3.125 Gigabits per second (Gbit/sec) link for transmission across a cable that needs to support high spread spectrum clocking applications and the present embodiment may receive, interpret, and retransmit the data across a different network at 3.0 Gbit/sec. The embodiment may include a receiver front end 112, sampling circuitry 116, comparison circuitry 125, a phase controller 135, clock circuitry 140, a flywheel 145, and a loop latency controller 150. Receiver front end 112 may receive a signal from a transmission medium, such as an optical fiber. The receiver front end 112 may include a low noise amplifier to amplify the signal to an amplitude appropriate for the sampling circuitry 116, producing a data signal 114.

Sampling circuitry 116 may receive data signal 114 from the receiver front end 112 and sample data from the data signal 114 with a sampling clock 120. Samples of the data signal 114 are taken to determine the data being transmitted as well as whether sampling clock 120 is in phase with data signal 114. In particular, the effective sampling window for accurate interpretation of data from data signal 114 may be reduced due to, e.g., noise introduced into the signal and phase changing characteristics of spread spectrum signals. As a result, samples of data will be more accurate on average if the samples are taken at the middle of the data.

The phase of the data signal 114 may be compared with the phase of the sampling clock 120 by taking more than one sample of each data bit. In some embodiments, sampling clock 120 may be a multiple of the frequency of an anticipated clock frequency for the data signal 114. In many embodiments, a sampling clock signal may be generated at a frequency substantially equivalent to the anticipated frequency of data signal 114. In the present embodiment, three samples of a data bit may be taken for each bit in data signal 114. For example, a sampling clock with a 90 degrees lead or lag may be generated based upon sampling clock 120. The rising and falling edges of both sampling clock 120 and the 90 degree, phase-shifted sampling clock can then be utilized as triggers for sampling data signal 114.

Comparison circuitry 125 may receive the samples of data signal 114 taken by sampling circuitry 116 and generate a comparison signal to indicate whether the phase of sampling clock 120 leads or lags data signal 114. In particular, comparison circuitry 125 may determine whether the phase of sampling clock 120 is different from the phase of data signal 114. If the phase of data signal 114 is different from the phase of sampling clock 120, comparison circuitry 125 also determines whether the phase of sampling clock leads or lags the phase of data signal 114. For example, three samples are taken for each bit of data signal 114, two based upon the rising and falling edges of sample clock 120 and one based upon the rising or falling edge of a 90 degree, phase-shifted sampling clock. When sampling clock 120 is in phase with data signal 114, the rising and falling edges of sample clock 120 should coincide with the rising and falling edges of data signal 114. Thus, samples should indicate the same bit value for each bit of data signal 114. Further, the sample from the 90 degrees, phase-shifted sample clock should produce the bit value of the data signal from the center of the sampling window.

However, when sample clock 120 is out of phase with data signal 114, the data sampled in response to the rising edge and falling edge of sample clock 120 will be different. For instance, when sample clock 120 lags data signal 114 by a several degrees, the bit value being sampled is a logical one, and the next bit value of data signal 114 is a logical zero, the first two samples may indicate a logical one while the last sample indicates a logical zero. Alternatively, when sample clock 120 leads data signal 114 by several degrees, the bit value being sampled is a logical one, and the previous bit value is a logical zero, the first sample may indicate a logical zero while the last two samples indicate a logical one.

Comparison circuitry 125 may include spread spectrum clocking circuitry 130. Spread spectrum clocking circuitry 130 may be circuitry or stages in the CDR loop added to accommodate high-speed adjustments to sampling clock 120. For instance, spread spectrum circuitry 130 may include latches between stages. The latches may maintain the results of computations based upon samples from sampling circuitry 116 while comparison circuitry 125 begins subsequent computations for subsequent samples.

However, in the absence of spread spectrum clocking for data signal 114, such high frequency adjustments may be unnecessary and the rate of adjustments made by phase controller 135 may be reduced. In such situations, spread spectrum clocking circuitry 130 may be bypassed or deactivated by loop latency controller 150, effectively merging the stages, to reduce power consumption. In some embodiments, for example, stages of logic may be combined into a single stage by deactivating latches between the stages. In further embodiments, additional changes to, e.g., comparison circuitry 125 may be implemented to bypass latches, merge stages, and/or reduce power consumption.

Phase controller 135 may generate one or more control signals to modify the phase of sampling clock 120 based upon computations by comparison circuitry 125 and transmit the control signal to clock circuitry 140 to implement the changes. More specifically, phase controller 135 is designed to operate at a high frequency to control the high-speed phase changes necessary for sampling clock 120 to accommodate spread spectrum clocking. Phase controller 135 may control the high-speed changes in response to the output of comparison circuitry 125. In the present embodiment, phase controller 135 may also transmit a signal to flywheel 145 to indicate each time that an adjustment is made to the phase of sampling clock 120 as well as the direction of the phase change.

When data signal 114 does not include spread spectrum signals, however, phase controlled 135 may operate at, e.g., half the frequency and still track the phase changes in data signal 114. Operating the phase controller 135, or circuit elements therein, at a reduced operating frequency, reduces power consumption. Further, the operating voltage can typically be reduced in conjunction with the operating frequency.

Flywheel 145 may dynamically accelerate and/or decelerate adjustments to the phase of sample clock 120, based upon a number of or pattern of adjustments implemented by phase controller 135, to accommodate for time-varying changes in the frequency of data signal 114. Advantageously, flywheel 145 may also provide a signal to loop latency controller 150 to indicate adjustments implemented by flywheel 145 to the phase of sampling clock 120. For example, phase controller 135 may make one unit of phase adjustment to sampling clock 120 in response to input from comparison circuitry 125. Flywheel 145 may then recognize a pattern of adjustments to the phase of sampling clock 120 in one direction and may instruct phase controller 135 to make an additional unit of phase adjustment to sampling clock 120.

Loop latency controller 150 couple with flywheel 145 to determine when spread spectrum signals are not being received and, in response, may reduce the frequency of operation of phase controller 135. For example, loop latency controller 150 may count the number of adjustments that flywheel 145 makes to phase changes in a given period of time to determine whether data signal 114 is a spread spectrum signal. When data signal 114 is not a spread spectrum signal loop latency controller 150 may reduce the frequency of operation for phase controller 135 by, e.g., half. In many embodiments, loop latency controller 150 may also reduce the internal operating voltage for receiver 110.

In several embodiments, loop latency controller 150 may output logic and/or latch control signals to merge stages of receiver 110 and/or simplify processing stages for the CDR loop of receiver 110. More specifically, loop latency controller 150 may deactivate or bypass spread spectrum circuitry 130, advantageously reducing power consumption by receiver 110. In further embodiments, loop latency controller 150 may implement changes in stages, reducing the circuitry involved with a stage of processing to reduce power. For example, phase controller 135 may include a 64 state rotator machine and loop latency controller 150 may, upon determining that data signal 114 does not include a spread spectrum signal, route the comparison signal(s) from comparison circuitry 125 through a simpler stage such as an eight state rotator machine, advantageously reducing power consumption by receiver 110.

Figure 2:
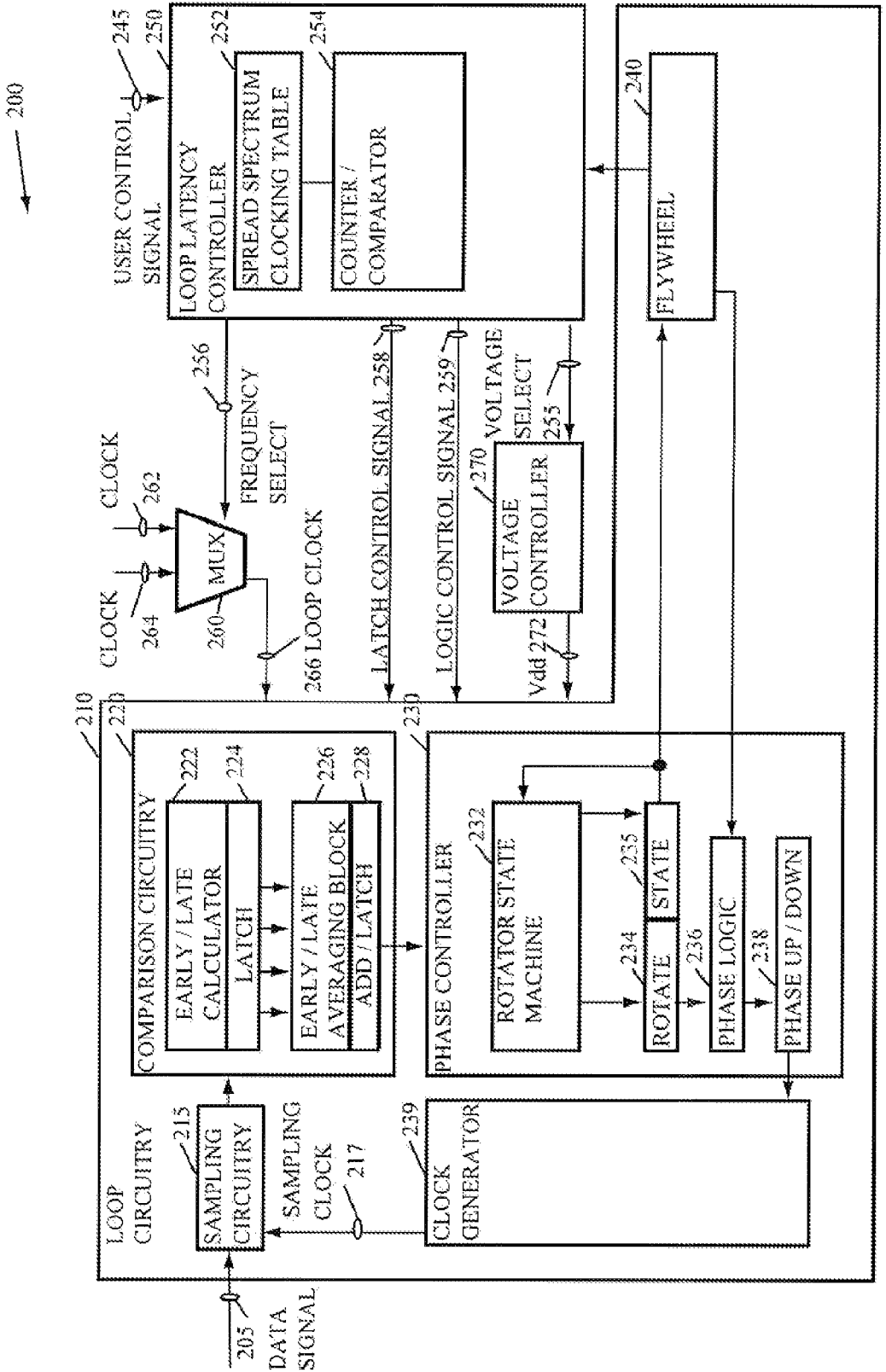
FIG. 2 depicts an embodiment of a CDR loop including a loop latency controller to reduce power consumption when spread spectrum clocking is deemed unnecessary based upon a spread spectrum clocking table.

FIG. 2 depicts an embodiment of a CDR loop 200 with spread spectrum clocking that can reduce power consumption in response to receipt of a data signal 205 that is not a spread spectrum signal. In particular, CDR loop 200 includes loop circuitry 210 and loop latency controller 250. Loop circuitry 210 may receive the data signal 205, sample bit values, and adjust a sampling clock 217 in response to a comparison of the samples with expected patterns of values. Loop circuitry 210 may include sampling circuitry 215, comparison circuitry 220, a phase controller 230, a clock generator 239, and a flywheel 240.

Sampling circuitry 215 takes more than one sample of each bit on average in data signal 205 to determine the value of each bit based upon sampling clock 217. Sampling circuitry 215 may store a large series of these bits in memory to transfer to comparison circuitry 220. In many embodiments, sampling circuitry 215 may take two or three samples per bit, although in some embodiments, sampling circuitry may take more than three samples per bit. Sampling data signal 205 more than once per bit increases the accuracy of value determinations for bits. For example, if two out of three samples for a bit indicate that the value of the bit is a logical one, then the value of the bit is more likely a logical one than a logic zero.

Comparison circuitry 220 may generate a comparison signal based upon the samples received from sampling circuitry 215 to indicate whether sampling clock 217 leads, lags, or is in-phase with data signal 205. In particular, comparison circuitry 220 may include an early/late calculator 222, a latch 224, an early/late averaging block 226, and an early/late adder or latch 228. Early/Late calculator 222 may analyze the samples on a bit per bit basis to indicate whether sampling clock 217 leads or lags data signal 205. Leading data signal 205 is often referred to as being early and lagging sampling clock 217 data signal 205 is often referred to as late. Latch 224 latches the early/late computations at the input for early/late averaging block 226 so early/late calculator 222 can begin processing the next set of samples from sampling circuitry 215.

After receiving the substantially instantaneous early and late determinations from early/late calculator 222, early/late averaging block 226 may average the bit per bit analysis to provide a more general trend. In particular, some of the individual analyses to determine whether sampling clock 217 leads or lags data signal 205 may be erroneous, but averaging the individual determinations over a longer period of time reduces the errors. The sum generated by early/late averaging block 226 is then latched at latch 228 to allow early/late averaging block 226 to begin computations on the subsequent early/late computations.

Note that many of the latches described in the last two paragraphs could be avoided if we could run all this control logic (early/late calculator, early/late averaging block, and phase controller) at a slower frequency. The present embodiment takes advantage of this via loop latency controller 250.

Phase controller 230 may interpret the averaged early/late sums over time to determine whether the phase of sampling clock 217 should be modified. More specifically, phase controller 230 may include rotator state machine 232, rotate 234, state 235, phase logic 236, and phase up/down 238. Rotator state machine 232 may determine whether the phase of sampling clock 217 should remain the same, be delayed, or be accelerated based upon the number of early and/or late signals phase controller 230 receives from early/late averaging block 226.

Rotate 234 may comprise a latch to receive the determination of rotator state machine 232 about whether the phase of sampling clock 217 should be accelerated, delayed, or remain the same and state 235 maintains the state for the state for rotator state machine 232 and returns the state to rotator state machine 232 for each determination.

Phase logic 236 may receive indications regarding whether to modify the phase of sampling clock 217 from rotator state machine 232 and flywheel 240. Based upon the indications, phase logic 236 determines whether to change the phase and whether the change should accelerate the phase or delay the phase. For example, phase logic 236 may receive an indication from rotator state machine 232 to accelerate the phase and may receive no indication from flywheel 240. In response, phase logic may accelerate the phase of sampling clock 217. Alternatively, neither rotator state machine 232 nor flywheel 240 may indicate a change to the phase of sampling clock 217 so phase logic may do nothing. And, as a further illustration, phase logic 236 may receive an indication from rotator state machine 232 of no change to the phase, possibly because rotator state machine 232 is unable to keep up with the changes, and flywheel 240 indicates that the phase of sampling clock 217 should be accelerated. Phase logic 236 may then determine that the phase should be accelerated.

Phase up/down 238 may latch the output of phase logic 236 to the input of clock generator 239 and clock generator 239 may implement the changes to the phase of sampling clock 217 in response to instructions from phase controller 230. Sampling clock 217 may then be output to sampling circuitry 215 to take additional samples of data signal 205.

Flywheel 240 may couple with state 235 and phase logic 236 to dynamically adjust phase changes of sampling clock 217 to track accelerating changes in the phase of data signal 205. More specifically, spread spectrum signaling may include accelerating and/or decelerating changes in the phase of data signal 205 that phase controller 230 is unable to match and flywheel 240 may recognize the acceleration and/or deceleration patterns based upon changes to state 235 that are indicative of such patterns. In response, flywheel 240 may transmit a signal to phase logic 236 to implement an additional phase change, accelerating changes to the phase of sample clock 217. In other situations, flywheel 240 may transmit a signal to phase logic 236 to prevent a phase change requested by rotator state machine 232, decelerating changes to the phase of sample clock 217. Further, flywheel 240 reports the change to loop latency controller 250.

Loop latency controller 250 is designed to recognize when flywheel 240 is not operating in a manner indicative of spread spectrum signaling and, in response, takes steps to reduce power consumption by loop circuitry 210. More specifically, loop latency controller 250 may include spread spectrum clocking table 252 and counter/comparator 254. Spread spectrum clocking table 252 may include information supplied by a user to indicate the amplitude and period of spread spectrum clocking that controls whether loop latency controller 250 takes steps that inhibit spread spectrum clocking functionality to reduce power consumption.

Counter/comparator 254 may determine whether signals received from flywheel 240 meet user criteria for spread spectrum clocking based upon the threshold count for flywheel 240 operations and the amplitude and period associated with the spread spectrum clocking. In response to reaching one of the user defined thresholds, and based upon the user defined reactions in spread spectrum clocking table 252, loop latency controller 250 may output frequency select 256, latch control signal 258, and logic control signal 259 to inhibit spread spectrum clocking functionality. In other words, upon determining that spread spectrum functionality should be inhibited to conserve power, loop latency controller 250 may output frequency select 256 to multiplexers, MUX 260, selecting a clock for loop circuitry 210 having a lower frequency to reduce the frequency of operation for portions of loop circuitry 210. For example, the default clock signal for enabling spread spectrum clocking for loop clock 266 may be clock 264 and an alternative clock 262 may be half or a quarter of the frequency of clock 264. When counter 254 determines that spread spectrum clocking is unnecessary based upon the settings for amplitude and period, loop latency controller may output frequency selected 256 to change a loop clock 266 from clock 264 to clock 262.

In some embodiments, loop latency controller 250 may output a voltage select 255 to a voltage controller 270 in addition to changing loop clock 266. In particular, many circuits or circuit elements can operate with a lower voltage, Vdd 272, as a supply source when the frequency of operation for the circuit elements is reduced. Thus, loop latency controller 250 may reduce the voltage, Vdd 272, in conjunction with the frequency of loop clock 266 to further reduce power consumption by loop circuitry 210.

Further, loop latency controller 250 may output a latch control signal 258 to disable or deactivate latches 224 and/or 228 of comparison circuitry 220. Disabling or deactivating latches 224 and 228 may merge stages early/late calculator 222 and early/late averaging block 226. (This is possible as long as the averaging does not operate on early/late signals that are too far back in time). For example, signals being directed toward a latch such as latches 224 and 228 may couples with latches 224 and 228 via multiplexers. If the latch control signal 258 is set, the multiplexers may couple the signals with the next stage of loop circuitry 220 rather than the latches.

In further embodiments, stages such as early/late calculator 222 and early/late averaging block 226 may require additional changes to logic to merge stages. Loop latency controller 250 may output logic control signal 259 to implement additional changes in conjunction with bypassing latch 224 to coordinate the merging of early/late calculator 222 and early/late averaging block 226. For instance, the output of early/late calculator 222, when transmitted via latch 224, may be coordinated with receipt of a second signal by early/late averaging block 226. The second signal may indicate, e.g., a divisor. Thus, logic control signal 259 may adjust processing of the second signal to coordinate receipt of the second signal with the output of early/late calculator 222.

In many embodiments, operation of loop latency controller 250 is automatic. In other embodiments, user control signal 245 may provide user with control (via a processor or directly) over the determination of whether to initiate steps to reduce power consumption. For example, the user may not expect data signal 205 to include spread spectrum signals. In particular, a register and/or some other input control may be set by the user that provides user control signal 245 to indicate that stages of loop circuitry 210 should be bypassed, deactivated or merged, or to indicate that the frequency of operation for loop circuitry 210, or a portion thereof, should be reduced.

Figure 3:
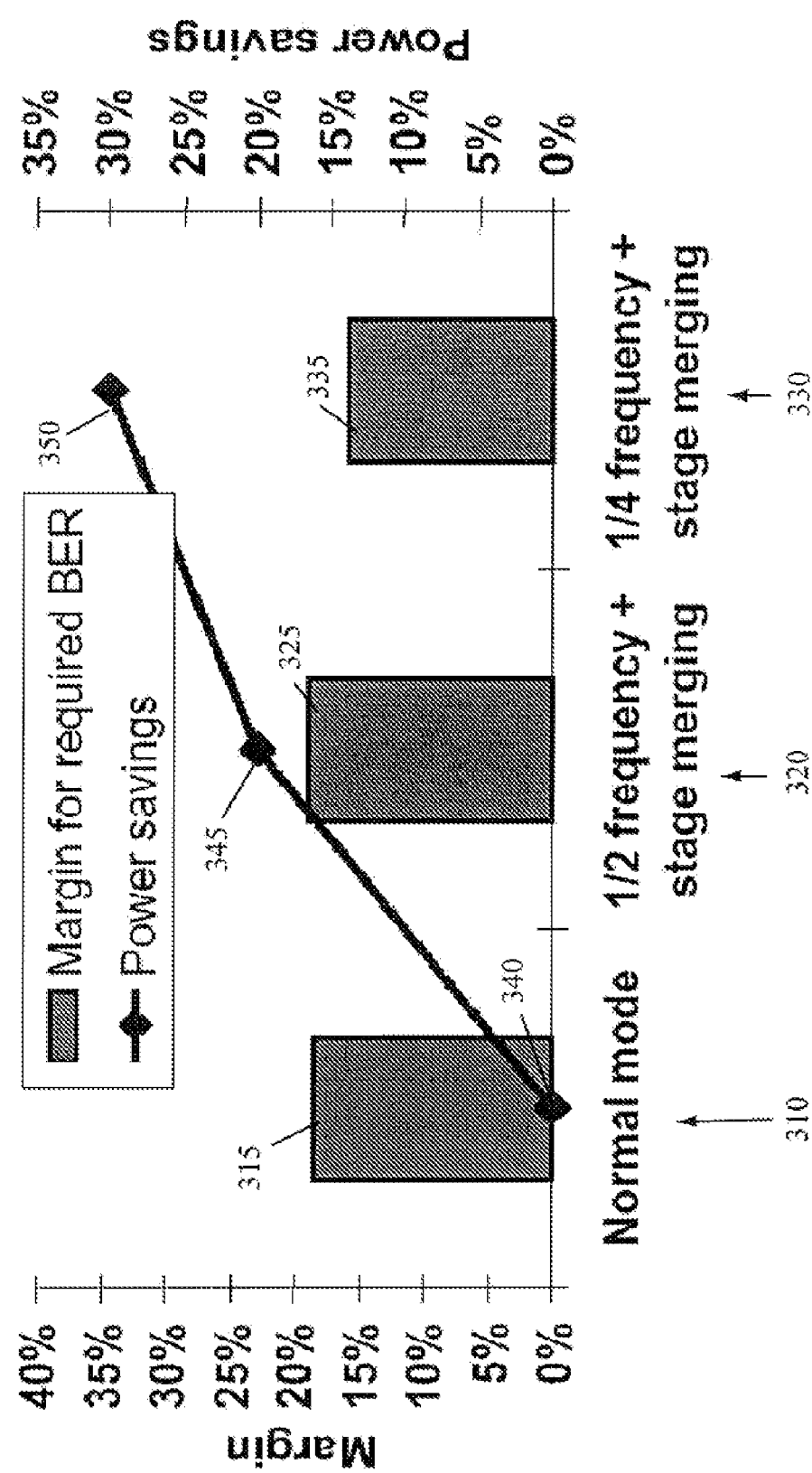
FIG. 3 depicts a graph describing power savings that result from merging stages and reducing an operating frequency for stages of a CDR loop.

FIG. 3 illustrates a graph 300 describing advantages of embodiments of the present invention. More specifically, graph 300 describes power savings of two different embodiments with respect to normal operation a circuit such as the CDR loop 200 in FIG. 2. The normal mode 310 represents a situation in which the loop circuitry 210 shown in FIG. 2 is operating with spread spectrum clocking enabled. The graphs above normal mode 310 indicate the margin for required BER and the power saving for loop circuitry 210 when spread spectrum clocking is enabled. The margin for BER 315 for normal mode 310 is close to 20% and the power savings 340 for the normal mode 310 is the reference point for the graph or zero percent.

The ½ frequency plus stage merging 320 represents the situation in which loop circuitry 210 operates rotator state machine 232 at one half the frequency of normal mode 310 and loop latency controller 250 has merged early/late calculator 222 and early/late averaging block 226 stages. Note that in ½ frequency plus stage merging 320 the margin of BER 325 is approximately equal to that of normal mode 310 but the power savings 345 is approximately 20%.

The ¼ frequency plus stage merging 330 represents the situation in which loop circuitry 210 operates rotator state machine 232 at one quarter the frequency of normal mode 310 and loop latency controller 250 has merged early/late calculator 222 and early/late averaging block 226 stages. Note that in ¼ frequency plus stage merging 330 the margin of BER 335 has reduced to just over 15% of normal mode 310 and the power savings 350 is approximately 30%.

Referring now to FIG. 4, there is shown an example of a flow chart 400 for reducing power consumption in a CDR loop such as CDR loop 110 shown in FIG. 1. Flow chart 400 begins with receiving a data signal (element 410). For example, the data signal may include a data signal that was clocked and transmitted without the corresponding clock signal to increase data bandwidth and to reduce noise associated with transmitting a clock signal along with a data signal.

Transitions of a sampling clock and a delayed sampling clock may trigger sampling circuitry to determine values of the data signal to take sample values for bits transmitted via the data signal (element 415). For example, the sampling clock may be received by the sampling circuitry and a circuit element designed to delay the sampling clock signal may be utilized to generate a second clock signal that lags the sampling clock signal, providing more than two transitions for sampling values per bit from the data signal when the sampling clock signal is close to the same frequency as the data signal.

The sample values can then be compared and averaged to determine a phase relationship between the data signal and the sampling clock signal and generate a comparison signal based upon the phase relationship (element 420). For instance, if three sample values are taken per bit and two of the sample values fall within the sampling window and one value appears to fall within the sampling window of the next bit then the phase of the sampling clock signal may lag the phase of the data signal. Then, the individual determinations about whether the phase of the sampling clock leads or lags the data signal can be averaged to reduce erroneous determinations.

With the comparison signal indicating whether the sampling clock signal leads or lags the data signal, the phase of the sampling clock signal may be adjusted to more closely match the data signal (element 425). More specifically, a phase controller may receive the comparison signal and transmit a signal to a clock generation circuit to step up the phase or step back the phase of the sampling clock to track the data signal. The clock generation circuit modifies generation of the sampling clock signal to incorporate the phase change. The clock generation circuitry then outputs the sampling clock to the sampling circuitry to take the subsequent set of sample values.

The phase adjustments for the sampling clock signal are monitored (element 430) and compared with a pattern to determine whether the phase controller is adequately tracking the changes. If the changes are occurring more rapidly than the phase controller can track, a flywheel or other similar circuitry may modify the adjustments to the phase of the sampling clock to track a phase of the data signal (element 435). For instance, changes in phase of the data signal may occur at a faster rate than the phase controller can track. Thus, the flywheel may implement additional phase changes to the sampling clock to track the data signal.

The modifications implemented by the flywheel are monitored to determine whether spread spectrum clocking is being utilized to track the data signal (element 440). When spread spectrum clocking is being utilized, the CDR loop is left to operate in a normal mode. For example, a loop latency controller may determine whether the number and types of modifications implemented by the flywheel are indicative of spread spectrum clocking to track a spread spectrum signal.

If the spread spectrum clocking capabilities are not being utilized, however, the loop latency controller may adapt a stage of the CDR loop (element 450). For example, the loop latency controller may reduce an operating frequency and possibly an operating voltage for the CDR loop circuitry, or at least portions thereof, to reduce the power consumption of the CDR loop.

In some embodiments, the loop latency controller may merge stages of the CDR loop when the spread spectrum clocking capabilities are not being utilized. For instance, loop latency controller may generate a signal that causes a latch coupled between an output of the stage and an input of the second stage to be bypassed, such as latch 224 between early/late calculator 222 and early/late averaging block 226 in FIG. 2.

In further embodiments, adapting the stage may include deactivating the stage and activating a second simpler stage, wherein the second simpler stage performs a substantially similar function as the stage. For example, the stage may include a multiple-state, rotator state machine and the second simpler stage may include a second rotator state machine. The multiple-state, rotator state machine may have more states than the second rotator state machine so the change reduces the complexity of the circuitry to implement the state rotator machine, which can reduce power consumption for the CDR loop.

It will be apparent to those skilled in the art having the benefit of this disclosure that the present invention contemplates methods and arrangements for extension of clock and data recovery loop latency and deactivation of clock and data recovery circuits. It is understood that the form of the invention shown and described in the detailed description and the drawings are to be taken merely as examples. It is intended that the following claims be interpreted broadly to embrace all the variations of the example embodiments disclosed.

What is claimed is:

1. An apparatus for reducing power consumption by a clock and data recovery loop circuit, comprising:
 a flywheel to monitor adjustments made in a phase of a sampling clock by a phase controller, the sampling clock being generated to sample bit values from a data signal, and to modify the adjustments in the phase of the sampling clock to track a phase of the data signal; and
 a loop latency controller to monitor the modifications of the adjustments to the phase of the sampling clock, to determine the existence of spread spectrum clocking based upon a pattern of the modifications, and, in response, to adapt a stage of the clock and data recovery loop circuit to operate with less power consumption.

2. The apparatus of claim 1, wherein the loop latency controller determines a frequency select signal to modify an operating frequency for the stage.

3. The apparatus of claim 1, wherein the loop latency controller couples with a multiplexer to select a clock frequency for the stage.

4. The apparatus of claim 1, wherein the loop latency controller couples with a voltage controller to reduce an operating voltage for the stage.

5. The apparatus of claim 1, wherein the loop latency controller outputs a control signal to merge the stage with a second stage of the clock and data recovery loop circuit.

6. The apparatus of claim 5, wherein the control signal comprises a latch control signal to bypass a latch coupled between an output of the stage and an input of the second stage.

7. The apparatus of claim 5, wherein the control signal comprises a logic control signal to coordinate a mergence of the stage with the second stage.

8. The apparatus of claim 1, wherein the loop latency controller outputs a control signal to deactivate the stage and activate a second simpler stage to perform a substantially similar function as the stage.

9. The apparatus of claim 1, wherein the stage comprises a multiple-state, rotator state machine and the second stage comprises a second rotator state machine, wherein the multiple-state, rotator state machine has more states than the second rotator state machine.

10. A clock and data recovery loop circuit, comprising:
 a clock generator to generate a sampling clock;
 sampling circuitry to sample values for a bit from a data signal based upon the sampling clock;
 comparison circuitry to compare the values for the bit to generate a comparison signal indicative of a difference between the phase of the sampling clock and the phase of the data signal;
 a phase controller to adjust the phase of sampling clock in response to the comparison signal;
 a flywheel to monitor adjustments in the phase of the sampling clock by the phase controller and to modify the adjustments in the phase of the sampling clock to track the phase of the data signal; and
 a loop latency controller to monitor the modifications of the adjustments in the phase of the sampling clock, to determine the existence of spread spectrum clocking based upon a pattern of the modifications, and, in response, to adapt a stage of the clock and data recovery loop circuit to operate with less power consumption.

11. The clock and data recovery loop circuit of claim 10, wherein the loop latency controller generates a frequency select signal to modify an operating frequency for the stage.

12. The clock and data recovery loop circuit of claim 10, wherein the loop latency controller couples with a voltage controller to modify an operating voltage for the stage.

13. The clock and data recovery loop circuit of claim 10, wherein the loop latency controller outputs a control signal to merge the stage with a second stage of the clock and data recovery loop circuit.

14. The clock and data recovery loop circuit of claim 10, wherein the loop latency controller outputs a control signal to deactivate the stage and activate a second simpler stage to perform a substantially similar function as the stage.

* * * * *